(12) United States Patent
Shaviv

(10) Patent No.: US 9,378,976 B2
(45) Date of Patent: Jun. 28, 2016

(54) METHOD FOR FORMING INTERCONNECTS

(71) Applicant: APPLIED Materials, Inc., Santa Clara, CA (US)

(72) Inventor: Roey Shaviv, Palo Alto, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 14/677,673

(22) Filed: Apr. 2, 2015

(65) Prior Publication Data

US 2015/0287675 A1 Oct. 8, 2015

Related U.S. Application Data

(60) Provisional application No. 61/974,332, filed on Apr. 2, 2014.

(51) Int. Cl.
*H01L 21/4763* (2006.01)
*H01L 21/44* (2006.01)
*H01L 23/52* (2006.01)
(Continued)

(52) U.S. Cl.
CPC .... *H01L 21/31144* (2013.01); *H01L 21/31111* (2013.01); *H01L 21/3212* (2013.01); *H01L 21/7684* (2013.01); *H01L 21/7685* (2013.01); *H01L 21/76802* (2013.01); *H01L 21/76822* (2013.01); *H01L 21/76843* (2013.01); *H01L 21/76871* (2013.01); *H01L 21/76877* (2013.01); *H01L 21/76882* (2013.01); *H01L 23/5329* (2013.01); *H01L 23/53295* (2013.01); *H01L 23/5226* (2013.01); *H01L 23/53223* (2013.01);
(Continued)

(58) Field of Classification Search
CPC ............ H01L 21/76877; H01L 21/76843; H01L 21/76802; H01L 21/76808; H01L 21/76807; H01L 21/76831; H01L 21/76897
USPC .......... 438/629, 637–640, 675; 257/618, 622, 257/774
See application file for complete search history.

(56) References Cited

U.S. PATENT DOCUMENTS 6,100,184 A 8/2000 Zhao
6,143,155 A 11/2000 Adams
(Continued)

OTHER PUBLICATIONS

Hamioud, K., et al., "32 nm Node BEOL Integration With an Extreme Low-k Porous SiOCH Dielectric k=2.3," Microelectronic Engineering 87(3):316-320, Mar. 2010.
(Continued)

*Primary Examiner* — Hsien Ming Lee
(74) *Attorney, Agent, or Firm* — Christensen O'Connor Johnson Kindness PLLC

(57) ABSTRACT

A conductive interconnect including trenches (110) and (186) and vias (202) are formed in a workpiece (100) by applying a dielectric film stack (120) over the workpiece, and thereafter applying photoresist (140) over the film stack. Trenches (142) are patterned in the photoresist, wherein the trenches are in segments disposed end-to-end to each other. The segments are longitudinally spaced apart from each other at locations where the vias (202) are to be located. The trenches are etched into the dielectric film stack, and then filled with conductive material to form metal line segments (186). Vias (192) are patterned in the gaps separating the adjacent ends of the longitudinally-related lines (186). The patterned vias are etched and then filled with a conductive material, with the ends of the adjacent line segments (186) serving to accurately locate the vias, in a direction along the lengths of the trenches.

8 Claims, 14 Drawing Sheets

(51) Int. Cl.
  *H01L 21/311*   (2006.01)
  *H01L 21/768*   (2006.01)
  *H01L 21/321*   (2006.01)
  *H01L 23/522*   (2006.01)
  *H01L 23/532*   (2006.01)

(52) U.S. Cl.
  CPC ..... *H01L 23/53238* (2013.01); *H01L 23/53252* (2013.01); *H01L 23/53266* (2013.01)

(56) References Cited

U.S. PATENT DOCUMENTS

| | | | |
|---|---|---|---|
| 6,268,287 B1 | 7/2001 | Young | |
| 6,399,508 B1 | 6/2002 | Ting | |
| 7,119,010 B2 * | 10/2006 | Lim | H01L 21/76897 257/774 |
| 7,135,402 B2 | 11/2006 | Lin | |
| 7,351,315 B2 | 4/2008 | Klocke | |
| 8,357,599 B2 | 1/2013 | Schieffer | |
| 2005/0098850 A1 * | 5/2005 | Kim | H01L 21/76229 257/510 |
| 2013/0320505 A1 | 12/2013 | Emesh | |
| 2014/0008812 A1 | 1/2014 | Emesh | |

OTHER PUBLICATIONS

Havemann, R.H., "High-Performance Interconnects: An Integration Overview," Proceedings of the IEEE 89(5):586-601, May 2001.

Kriz, J., et al., "Overview of Dual Damascene Integration Schemes in Cu BEOL Integration," Microelectronic Engineering 85(10):2128-2132, Oct. 2008.

Wolf, S., "15.4 Introduction to Dual-Damascene Interconnect Processes," Lattice Press, excerpt from "Silicon Processing for the VLSI Era, vol. 4: Deep-Submicron Process Technology," 2002, pp. 674-679.

\* cited by examiner

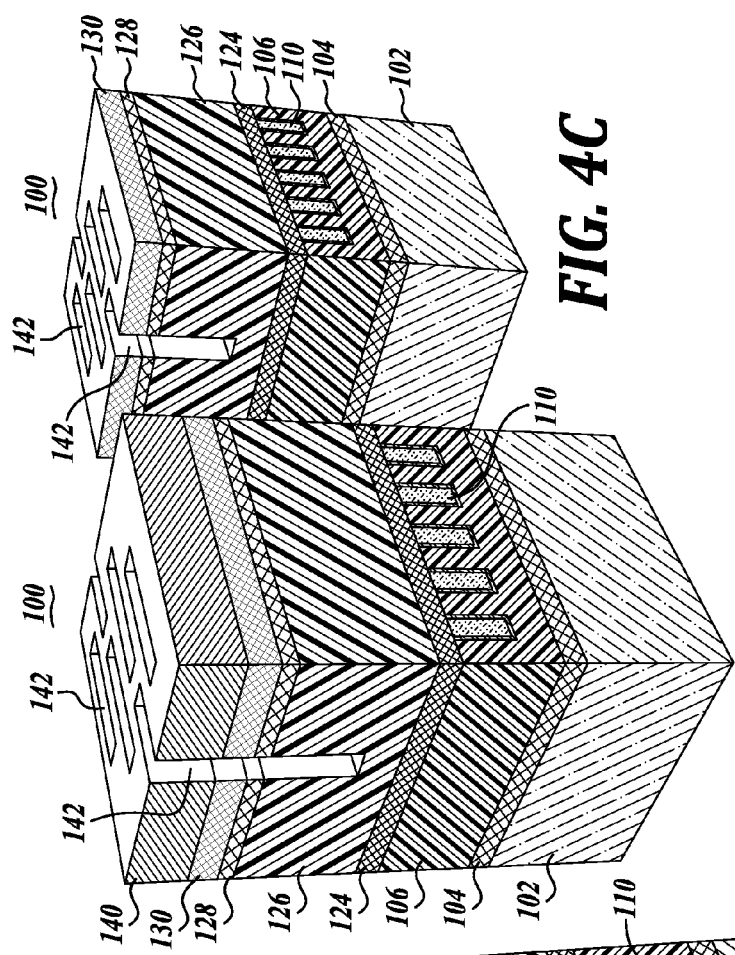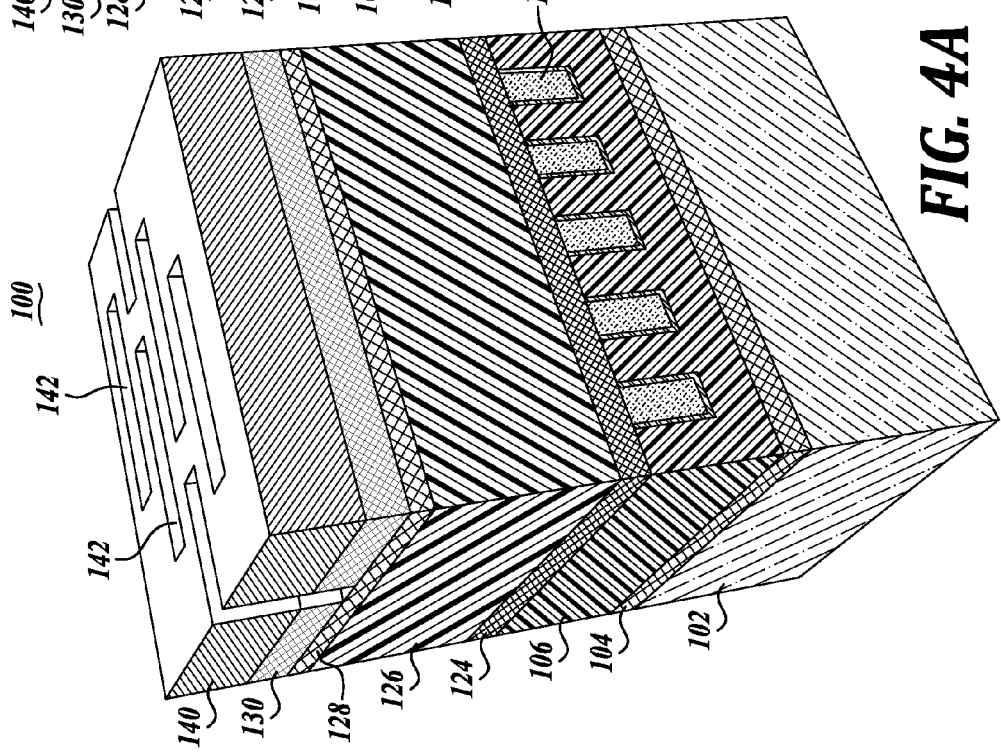
FIG. 4A   FIG. 4B   FIG. 4C

METHOD FOR FORMING INTERCONNECTS

CROSS REFERENCE TO RELATED APPLICATION

The present application claims the benefit of U.S. Provisional Application No. 61/974,332, filed Apr. 2, 2014, the disclosure of which is hereby expressly incorporated by reference in the present application.

TECHNICAL FIELD

Embodiments of the present disclosure relate to the field of semiconductor wafer processing and, more particularly, to a technique for fabricating a Damascene metal interconnect structure as part of an integrated circuit in which low dielectric constant dielectric layers are used for the inter-level dielectric.

BACKGROUND

An integrated circuit is an interconnected ensemble of devices formed within a semiconductor material and within a dielectric material overlying a surface of the semiconductor material. Devices which may be formed within the semiconductor include MOS transistors, bipolar transistors, diodes, and diffused resistors. Devices which may be formed within the dielectric include wiring layers, thin film resistors, inductors and capacitors. The devices are interconnected by conductor paths formed within the dielectric. Typically, two or more levels of wiring, with successive levels separated by a dielectric layer containing connecting vias, are employed as interconnections. In current practice, copper and inorganic silicon oxide based dielectrics are commonly used for, respectively, the conductor and the dielectric materials.

In the manufacture of devices on a semiconductor wafer, it is common practice to fabricate multiple levels of conductive metal layers above a substrate. The multiple metallization layers are employed in order to accommodate higher densities as device dimensions shrink to deep sub-micron design rules. Likewise, the size of interconnect structures continues to shrink in order to accommodate the smaller dimensions.

Damascene metallization approaches have been employed to create inlaid metal structures, especially when utilizing copper interconnect metallization. In the single Damascene approach, the via dielectric is deposited and etched, then it is filled with metal (barrier and conductor) and planarized using chemical mechanical polishing (CMP) techniques. The trench dielectric is then deposited and patterned to allow deposition of the trench metallization, followed again by planarization. In a dual Damascene integration scheme, the via and trench structures are formed in the completed dielectric stack, then the metal is deposited in both structures at the same time.

The dual Damascene process offers an advantage in process simplification by reducing the process steps required to form the vias and trenches for a given metallization level. The openings for the wiring of a metallization level and the underlying via connecting the wiring to a lower metallization level are formed sequentially, prior to metal interconnect formation. The procedure provides an advantage in lithography and allows for improved critical dimension control. Subsequently, both the via and the trench can be filled utilizing the same metal-filling steps and planarized concurrently, thereby reducing the number of processing steps required.

For several technology generations, the typical integration approach for interconnect metallization has been the dual Damascene approach where a trench and a via are inlaid in a dielectric film stack, filled by a metal, and planarized using CMP to form an inlaid metal interconnect (see, for example, Zhao et al., U.S. Pat. No. 6,100,184). Dual Damascene patterning schemes can be categorized as "via first" or "trench first," based on which pattern is etched first. Approaches have been the "trench over via—via first" integration (see, for example, R. H. Havemann and J. A. Hutchby in *Proceedings of the IEEE* 89, #5, pp. 586-601, 2001, and references therein) and the "metal hard-mask—trench first" integration (see, for example, J. Kriz et al. in *Microelectronic Engineering*, Vol. 85, #10, pp. 2128-2132, 2008, and references therein and also K. Hamioud et al. in *Microelectronic Engineering* Vol. 87, #3, pp. 316-320, 2010, and references therein).

Regardless of the integration scheme chosen, various dielectric materials may be chosen, driven by the requirements for the technology being implemented. Also, several different combinations of metal layers could be used to build the interconnect structure. The combinations may include diffusion barrier materials deposited by PVD, CVD, or ALD techniques which typically contain nitrides of refractory metals. Materials such as ruthenium, cobalt or manganese could also be included in the metal stack. The conductors are typically copper, but could also contain other metals such as cobalt, aluminum, manganese, gold, silver, titanium, nickel, or alloys thereof. It has also become common to use a metal capping layer to reduce electromigration of fine interconnects. These layers are typically deposited using electroless deposition or a CVD deposition technique.

New approaches for patterning, etch, and metallization are required as existing approaches become inadequate at these small dimensions. The present disclosure seeks to extend Damascene technology to metallization half-pitches of 16 nm or less (pitches of 32 nm or less) in accordance with the ITRS. Dual Damascene technology, using various hard masks and multiple lithography and etch steps per layer, is becoming increasingly complicated and expensive. Moreover, the single step metallization used in dual Damascene integration necessitates line and via fill taking place together. Single step metallization can impose a burden on the metallization process because via processing may have different requirements from line processing. An approach separating via formation from the line formation could simplify processing while improving process control. One way to achieve separation is the single Damascene integration scheme. The approach has its own limitations, however. In particular, line alignment to via becomes difficult, since the two are formed at different levels. Cost is another disadvantage to the approach.

Metallization of narrow features poses a series of challenges. Keys among them are: patterning, gap fill, and reliability. The fine line width requirements are driving a need for new lithography methods, including double-patterning, which can improve the resolution in one axis, but not in both axes of the wafer plane. It is also becoming more difficult to execute steps such as pore-sealing of low dielectric constant materials after underlying metal layers are exposed, thereby reducing the choices for chemical treatment. Furthermore, it is becoming increasingly difficult to deal with topography during the lithography and etch sequence, while maintaining fine feature dimensions. Additionally, it is becoming more difficult to achieve void-free filling of narrow features with conductive metal. However, voids may have a tendency to migrate and coalesce under electrical stress. Indeed, the small features of the metal interconnects themselves tend to increase resistivity and the electromigration of the interconnect metal.

Therefore, there exists a need for an improved integration scheme not limited by the aforementioned problems. The present disclosure provides an alternative integration scheme to create features (such as trenches and vias, particularly in Damascene applications) of a microelectronic workpiece which does not suffer from the problems associated with conventional integration schemes.

SUMMARY

The summary is provided to introduce a selection of concepts in a simplified form further described below in the Detailed Description. The summary is not intended to identify key features of the claimed subject matter, nor is it intended to be used as an aid in determining the scope of the claimed subject matter.

In accordance with one embodiment of the present disclosure, a method of forming an interconnect composed of metallized lines and vias in a workpiece is provided. The method includes (a) forming metal lines in a workpiece, with the metal lines disposed in longitudinally spaced-apart line segments, the line segments spaced apart from each other end-to-end; and (b) forming vias in a workpiece, wherein at least one end of a first formed metal line constrains one cross-sectional dimension of a second formed via, or wherein at least one end of a first formed via constrains one cross-sectional dimension of a second formed metal line.

In accordance with another embodiment of the present disclosure, a method of forming an interconnect including trenches and vias in a workpiece is provided. The method includes applying a dielectric film stack on the workpiece; applying a hard mask over the dielectric film stack; applying a photoresist over the hard mask; patterning trenches in the photoresist, the trenches being patterned in longitudinal segments disposed end-to-end to each other, the segments longitudinally spaced apart from each other at locations where vias are to be located; etching trenches into the dielectric film stack; filling the trenches with a conductive material; patterning vias in the gaps separating the ends of longitudinally related filled trenches; etching the patterned vias in the workpiece; and filling the etched vias with the conductive material.

In accordance with another embodiment of the present disclosure, a method of forming an interconnect including trenches and vias in a workpiece is provided. The method includes applying a dielectric film stack on the workpiece; applying a hard mask over the dielectric film stack; applying a photoresist over the hard mask; patterning vias in the photoresist defining gaps separating vias; etching the patterned vias in the workpiece; filling the etched vias with the conductive material; patterning trenches in the photoresist, the trenches being patterned in longitudinal segments disposed end-to-end to each other in the gaps separating the vias, the segments longitudinally spaced apart from each other at the locations of the vias; etching trenches into the dielectric film stack; and filling the trenches with a conductive material.

In accordance with another embodiment of the present disclosure, a semiconductor workpiece comprising trenches and vias is provided. The work piece produced by: applying a dielectric composition on the workpiece; applying a hard mask over the dielectric composition; applying a photoresist over the hard mask; patterning trenches in the photoresist, the trenches being patterned in longitudinally arranged segments disposed end-to-end to each other, the longitudinal segments spaced apart from each other at locations where vias are to be located; etching trenches into the dielectric composition; filling the trenches with a conductive material; patterning vias in the gaps separating the ends of longitudinally related trenches; etching the patterned vias in the dielectric composition; and filling the etched vias with the conductive material.

In accordance with another embodiment of the present disclosure, a semiconductor workpiece comprising trenches and vias is provided. The work piece produced by: applying a dielectric film stack on the workpiece; applying a hard mask over the dielectric film stack; applying a photoresist over the hard mask; patterning vias in the photoresist defining gaps separating the vias; etching the patterned vias in the workpiece; filling the etched vias with the conductive material; patterning trenches in the photoresist, the trenches being patterned in longitudinal segments disposed end-to-end to each other in the gaps separating the vias, the segments longitudinally spaced apart from each other at the locations of the vias; etching trenches into the dielectric film stack; and filling the trenches with a conductive material In accordance with any of the embodiments describe herein, further comprising applying a photoresist over the workpiece and patterning trenches for the metal lines on the photoresist by photolithography.

In accordance with any of the embodiments describe herein, the trenches may be patterned by a process selected from the group consisting of multiple patterning, immersion lithography, extreme ultraviolet lithography, and combinations thereof.

In accordance with any of the embodiments describe herein, further comprising etching of the trenches in the workpiece by pattern etching.

In accordance with any of the embodiments describe herein, further comprising repairing damage to the etched trenches and sealing the trenches with a hydrocarbon precursor.

In accordance with any of the embodiments describe herein, further comprising depositing a barrier layer over the surfaces of the trenches.

In accordance with any of the embodiments describe herein, further comprising depositing a seed layer over the barrier layer.

In accordance with any of the embodiments describe herein, further comprising filling the trench with the conductive material to form the metal lines.

In accordance with any of the embodiments describe herein, further comprising thermally treating the workpiece to induce reflow of the conductive material into the trench to create a first conductive layer.

In accordance with any of the embodiments describe herein, further comprising depositing at least one additional conductive layer after the first conductive layer, and thermally treating the workpiece to induce reflow of each additional conductive layer.

In accordance with any of the embodiments describe herein, further comprising applying a metal material overburden to the filled trenches.

In accordance with any of the embodiments describe herein, further comprising using CMP to remove the overburden and reduce the height of the workpiece, to expose the workpiece and the metallized lines.

In accordance with any of the embodiments describe herein, further comprising, after formation of the lines or trenches, applying the photoresist over the metal lines, and patterning vias on such photoresist.

In accordance with any of the embodiments describe herein, further comprising etching of the vias and filling the etched vias with the conductive material.

In accordance with any of the embodiments describe herein, further comprising etching of the vias, applying a barrier layer over the via surface to overlie the via surface, and filling the vias with the conductive material.

In accordance with any of the embodiments describe herein, a metal overburden of the via conductive fill material may be applied to the workpiece.

In accordance with any of the embodiments describe herein, further comprising removing the overburden to reduce the height of the workpiece to expose the workpiece and the metallized vias and trenches.

In accordance with any of the embodiments describe herein, wherein, after formation of the trenches or the vias, the photoresist may be applied over the trenches or vias, and the vias or trenches are patterned on such photoresist.

In accordance with any of the embodiments describe herein, wherein, after the etching of the vias, a barrier layer may be deposited over the via surface.

In accordance with any of the embodiments describe herein, wherein a metal overburden of the via fill material may be applied to the workpiece.

In accordance with any of the embodiments describe herein, further comprising removing the overburden to reduce the height of the workpiece to expose the metallized trenches and aligned vias.

DESCRIPTION OF THE DRAWINGS

The foregoing aspects and many of the attendant advantages of the disclosure will become more readily appreciated as the same become better understood by reference to the following detailed description, when taken in conjunction with the accompanying drawings, wherein:

FIGS. 4A, 4B, and 4C are views of the workpiece of FIG. 3 after etching and resist stripping;

FIG. 6 is a schematic flow diagram depicting a portion of the workpiece of

FIG. 5B depicting partial fill and reflow metallization techniques;

DETAILED DESCRIPTION

Figure 1:
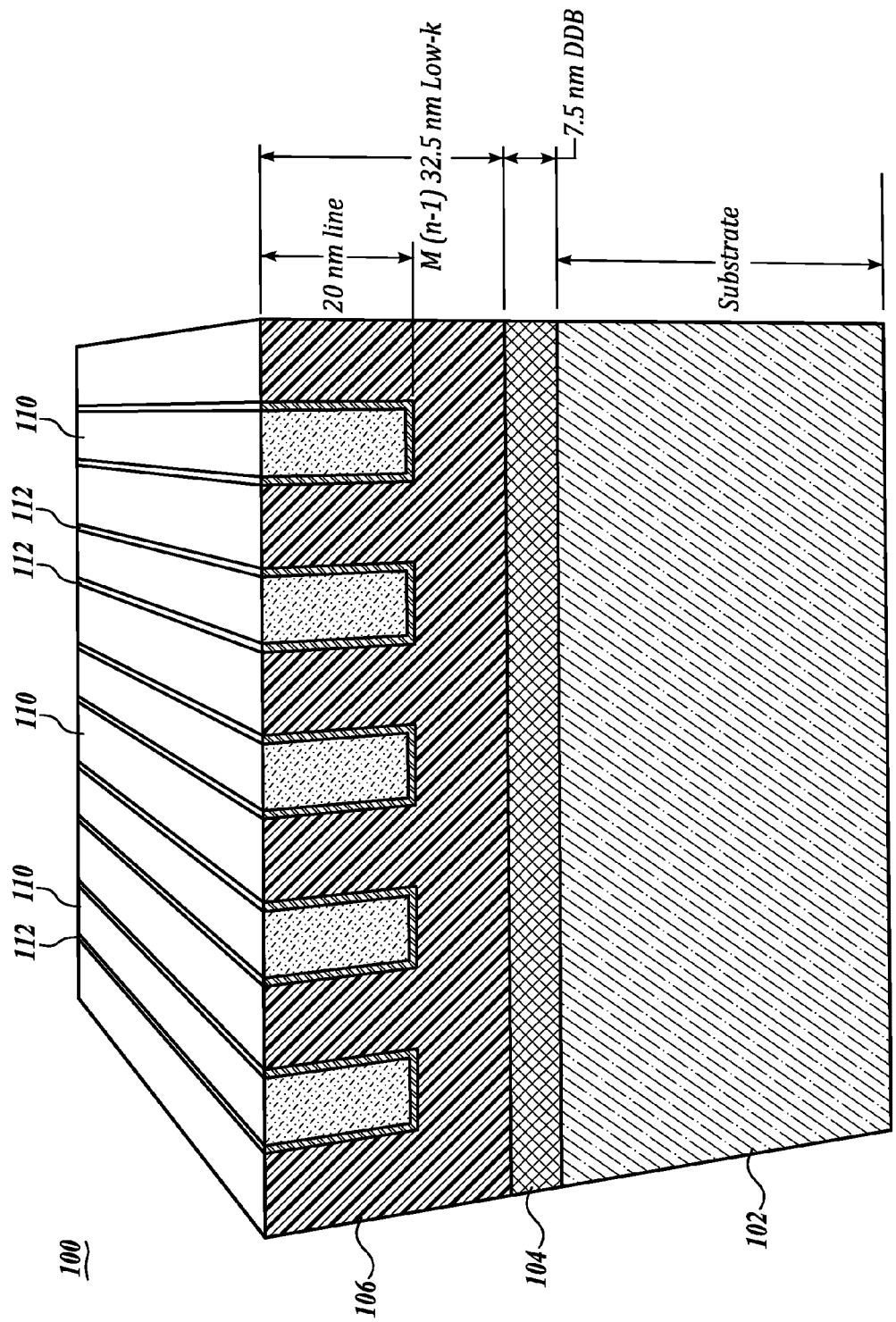
FIG. 1 is a schematic process diagram illustrating a starting workpiece used in conjunction with one embodiment of the present disclosure.

Embodiments of the present disclosure are directed to workpieces, such as semiconductor wafers, devices or processing assemblies for processing workpieces, and methods of processing the same. The terms workpiece, wafer, and semiconductor wafer mean any flat media or article, including semiconductor wafers and other substrates or wafers, glass, mask, and optical or memory media, MEMS substrates, or any other workpiece having micro-electric, micro-mechanical, or microelectro-mechanical devices.

Processes described herein are to be used for producing interconnects in the features of workpieces, which include trenches and vias. In one embodiment of the present disclosure, the process may be used to produce small feature interconnects, for example, features having a width or diameter of less than 30 nm. However, the processes of the present disclosure are applicable to any feature size. The dimension sizes discussed in the present application are post-etch feature dimensions at the top opening of the feature. The processes described herein may be applied to various forms of copper, cobalt, nickel, gold, silver, manganese, tin, aluminum, and alloy deposition, for example, in Damascene type applications. In embodiments of the present disclosure, features may be selected from the group consisting of features having a size of less than 30 nm, about 5 to less than 30 nm, about 10 to less than 30 nm, about 15 to about 20 nm, about 20 to less than 30 nm, less than 20 nm, less than 10 nm, and about 5 to about 10 nm.

The descriptive terms "micro-feature workpiece" and "workpiece" as used herein include all structures and layers previously deposited and formed at a given point in the processing, and are not limited to just those structures and layers as depicted in the Figures.

Although generally described as metal deposition in the present application the term "metal" also contemplates metal alloys. Such metals and metal alloys may be used to form seed layers or to fully or partially fill the feature. Exemplary copper alloys may include, but are not limited to, copper manganese and copper aluminum. As a non-limiting example, the alloy composition ratio may be in the range of about 0.5% to about 6% secondary alloy metal, as compared to the primary alloy metal (e.g., Cu, Co, Ni, Ag, Au, Mn, Sn or Al).

The conventional fabrication of metal interconnects may include a suitable deposition of a barrier layer on the dielectric material to prevent the diffusion of metal into the dielectric material. Suitable barrier layers may include, for example, Ta, Ti, TiN, TaN, Mn, or MnN. Suitable barrier deposition methods may include PVD, ALD, and CVD. Barrier layers are typically used to isolate copper or copper alloys from dielectric material; however, in the case of other metal interconnects, diffusion may not be a problem and so a barrier layer may not be required.

The barrier layer deposition may be followed by an optional seed layer deposition. In the case of depositing metal in a feature, there are several options for the seed layer. The seed layer may be (1) a seed layer (as a non-limiting example, a PVD copper seed layer), (2) a stack film composed of a liner layer and a seed layer (as a non-limiting example, a CVD Ru liner layer and a PVD copper seed layer), or (3) a secondary seed layer (as a non-limiting example, a CVD or ALD Ru secondary seed layer). However, other methods of depositing these exemplary seed layers are contemplated by the present disclosure.

The seed layer may be a metal layer, such as copper, cobalt, nickel, gold, silver, manganese, tin, aluminum, ruthenium, and alloys thereof.

As discussed above, a liner layer is a material used as an alternative seed or to help mitigate discontinuous seed issues and improve adhesion of the seed layer. Liners are typically noble metals such as Ru, Pt, Pd, and Os, but the list may also include Co and Ni. Currently, CVD Ru and CVD Co are common liners; however, liner layers may also be formed by using other deposition techniques, such as PVD or ALD. The thickness of the liner layer may be in the range of around 5 Ångstroms to 50 Ångstroms.

Also discussed above, a secondary seed layer is similar to a liner layer as being typically formed from noble metals such as Ru, Pt, Pd, and Os, but the list may also include Co and Ni, and also commonly CVD Ru and CVD Co. The difference is the secondary seed layer serves as the seed layer, whereas the liner layer is an intermediate layer between the barrier layer and the seed layer. Secondary seed layers may also be formed by using deposition techniques other than CVD, such as PVD or ALD.

The liner or secondary seed deposit may be thermally treated or annealed at a temperature between about 100° C. to about 500° C. in a forming gas environment (e.g., 3-5% hydrogen in nitrogen or 3-5% hydrogen in helium) to remove any surface oxides, densify the secondary seed or liner layer, and improve the surface properties of the deposit. The liner or secondary seed deposit may additionally be passivated by soaking in gaseous nitrogen (N2 gas) or other passivation environments to prevent surface oxidation. Passivation of the liner or secondary seed is described in U.S. Pat. No. 8,357,599, issued Jan. 22, 2013, the disclosure of which is herein expressly incorporated by reference in its entirety.

After a seed layer has been deposited (such as one of the non-limiting examples of PVD copper seed, PVD copper seed including CVD Ru liner, or CVD Ru secondary seed, or another deposition metal or metal alloy, layer combination, or deposition technique), the feature may include a conformal metal layer after the seed layer. However, a conformal metal layer may be deposited directly on the barrier layer, i.e., without a seed layer.

Referring to FIG. 1, a workpiece 100 is illustrated with preexisting metallization. The workpiece 100 includes a substrate 102 typically composed of monocrystalline silicon. A barrier layer 104 is disposed over the substrate 102 and underlies a low-k dielectric layer 106. The barrier layer can be made from numerous materials such as tantalum nitride in a thickness range of about 7.5 nanometers (nm), for example. The low-k dielectric layer may be composed of, for example, silicon dioxide, silicon dioxide doped with fluorine or carbon, phosphosilicate glass (PSG) or borophosphosilicate glass (BPSG). As one example, the low-k dielectric layer 106 may be about 32.5 nm thick, for example.

An array of copper based metallization in the form of trenches 110 are formed in the dielectric layer 106. The trenches are lined with the metal barrier 112 of, for instance, about 1 nm thick. The barrier can be composed of tantalum nitride or other appropriate barrier material, noted above. In FIG. 1, the illustrated metallization material is copper having a line width of about 8 nm and a depth of about 20 nm, for example. Also by way of example only, the trenches shown in FIG. 1 are positioned with a 20 nm pitch with the total thickness of the trench being 10 nm, and thus the separation between adjacent trenches being 10 nm. Of course, other pitch and thickness dimensions can be used.

Figure 2:
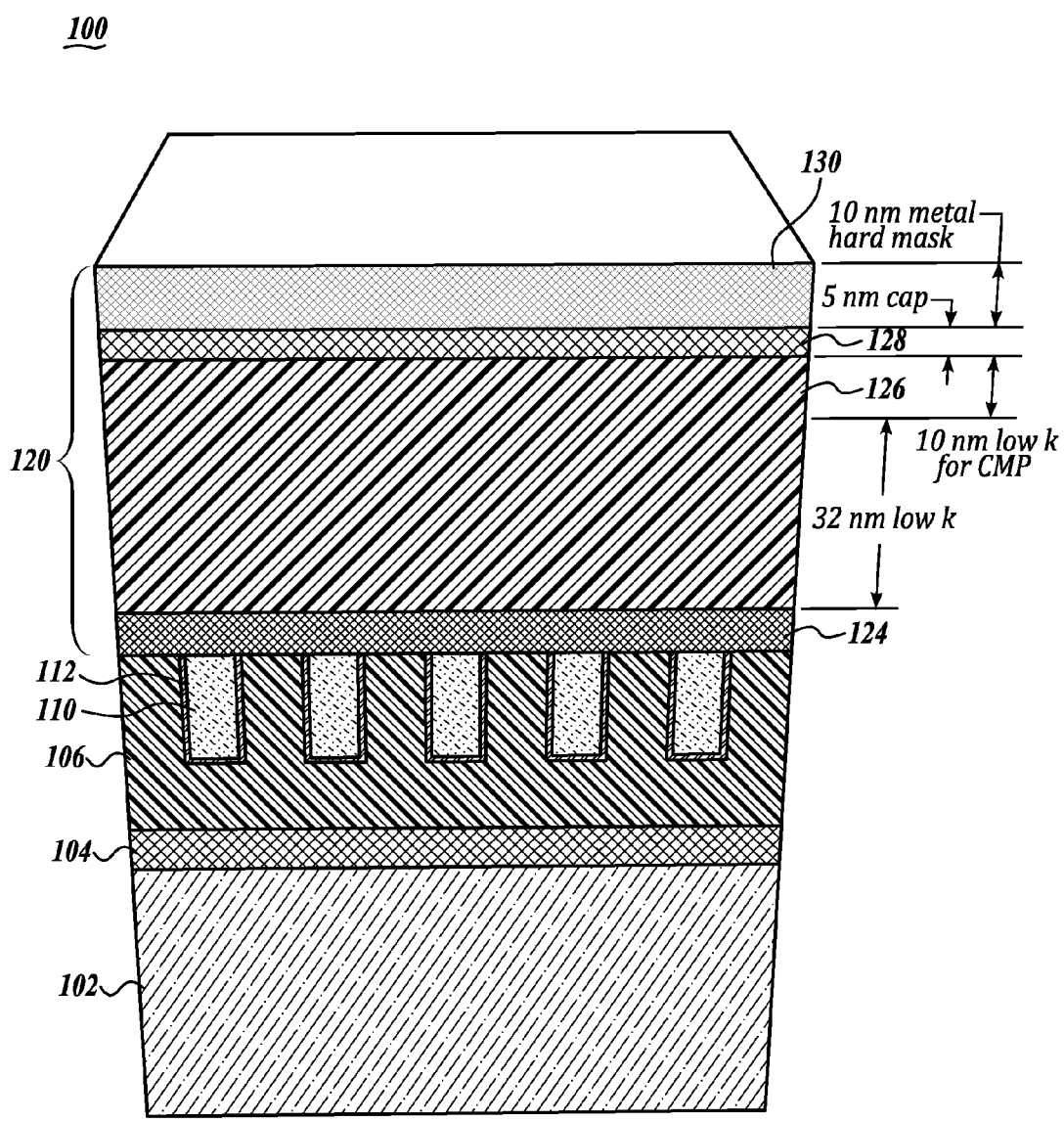
FIG. 2 is a view of FIG. 1 after deposition of a dielectric film stack.

Next, referring to FIG. 2, a dielectric film-stack 120 is deposited over the dielectric layer 106 of FIG. 1. The dielectric film-stack 120 can be of numerous different constructions or compositions. By way of illustration only, the film-stack 120 shown in FIG. 2 includes a barrier layer 124, which, as in barrier layer 104, can be composed of tantalum nitride or other appropriate material. Also, as in barrier layer 104, the barrier layer 124 can be, for example, of about 7.5 nm thick. Next, a second low-k dielectric layer 126 is disposed over barrier layer 124. The dielectric layer 126 can be of the same or similar composition as dielectric layer 106 or can be of other low-k dielectric material. The overall thickness of the dielectric layer 126 can be from 40 to 44 nm, by example only. Next, a barrier or cap layer 128 is disposed over the dielectric layer. The cap layer may be composed of $SiO_2$, typically applied by plasma-enhanced chemical vapor deposition (PE-CVD) or a tetra ethyl oxy silane-based CVD process.

Next, at the top of the metal cap is a metal hard mask 130 of one or more various compositions. For example, the hard mask can be composed of a metal or metal alloy, such as TiN, deposited by PVD. The hard mask layer can be deposited by numerous known methods, including PVD or CVD techniques or thermal oxidation techniques. Rather than consisting of a single uniform layer, the hard mask layer 130 can be composed of two or more layers of hard mask material. By way of illustration only, the hard mask layer 130 shown in FIG. 2 may be about 10 nm thick. Of course, other thicknesses for the hard mask layer may be utilized.

Figure 3:
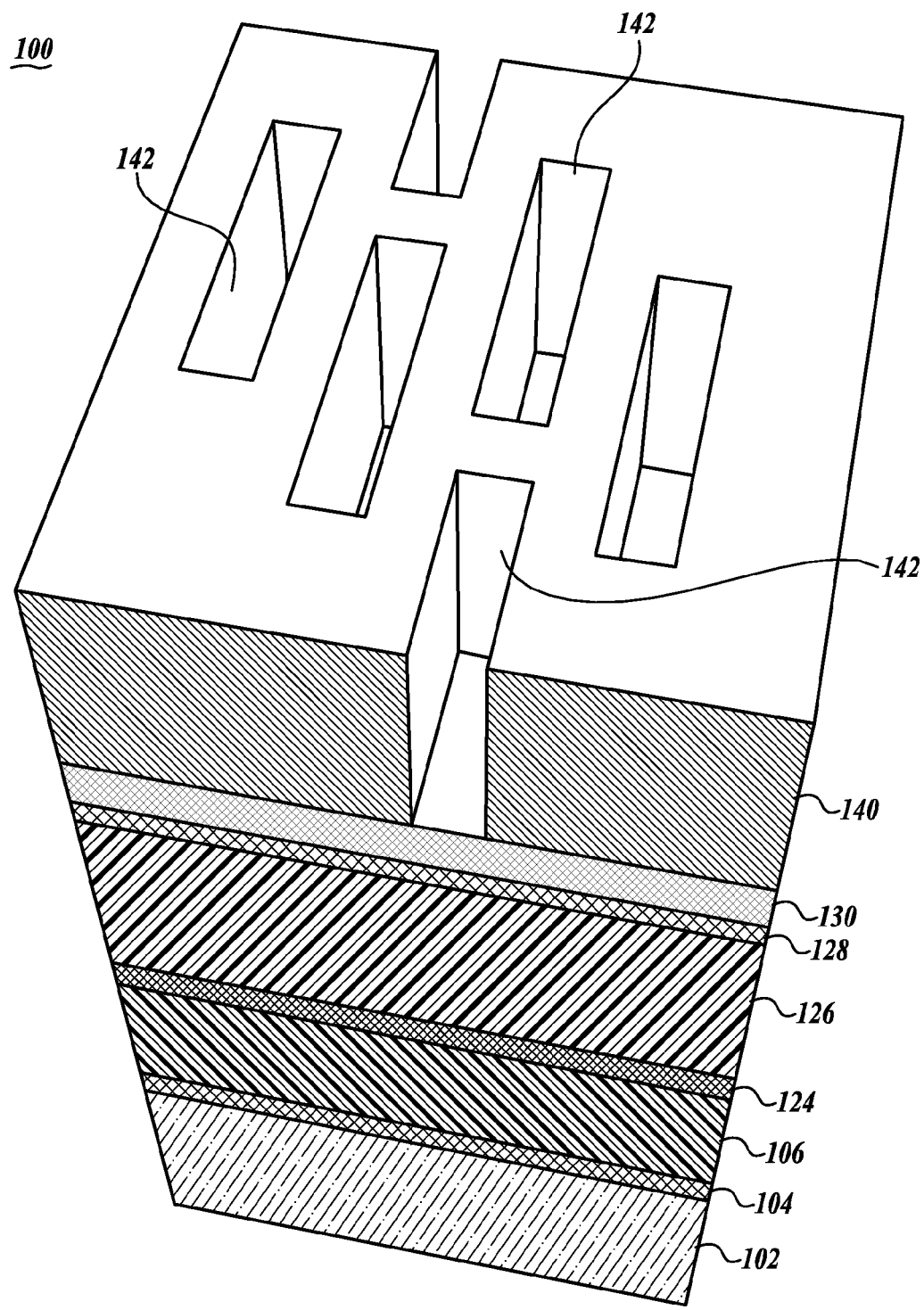
FIG. 3 is a schematic view of the workpiece of FIG. 2 after application of photoresist and then patterning thereof.

Next, referring to FIG. 3, a photoresist layer 140 is spun onto the workpiece in a standard manner. Also, in a standard manner, a pattern for trenches 142 is formed in the photoresist by known photolithography techniques. As shown in FIG. 3, only the trenches 142 are patterned and formed, which is different in approach from the conventional "trench first" process. Also, as shown in FIG. 3, the trenches are patterned in elongated sections rather than in a continuous longitudinal line. The purpose of patterning in the manner described is to leave a gap between the trenches where the vias are to be patterned later.

The patterning of the trenches 142 can be carried out by "cut masks." Also, multiple-patterning (including for example, double or quadruple patterning), immersion lithography, EUV, or other known patterning approaches may be used.

Next, referring to FIGS. 4A, 4B, and 4C, the trenches 142 are etched into the dielectric material 126. Such etching can be carried out by standard etch technology. The etching can take place in multiple steps. First, the photoresist and hard mask are etched and then thereafter the barrier layer 128 and the dielectric 126 are etched.

The surface dielectric pores of the dielectric layer 126 may be damaged by the etching process. Such damage can be repaired and sealed with a pore sealing product.

The ability to repair and seal the trench within the dielectric is a significant advantage in the present methodology because such repair and sealing occurs before via etch and also does not pose a risk of damaging the underlying metal layer. After via etch, the exposed metal at the bottom of the via is subject to damage during repair and sealing steps using oxygen-containing treatments and chemicals.

Next, as shown in FIG. 4C, the photoresist 140 is removed by standard methods. Although not shown, the hard mask 130 may also be removed. Removal of the photoresist and 140 and hard mask 130 may provide the advantage of resulting in a smaller aspect ratio for the metallization of the trench 142.

Figure 5C:
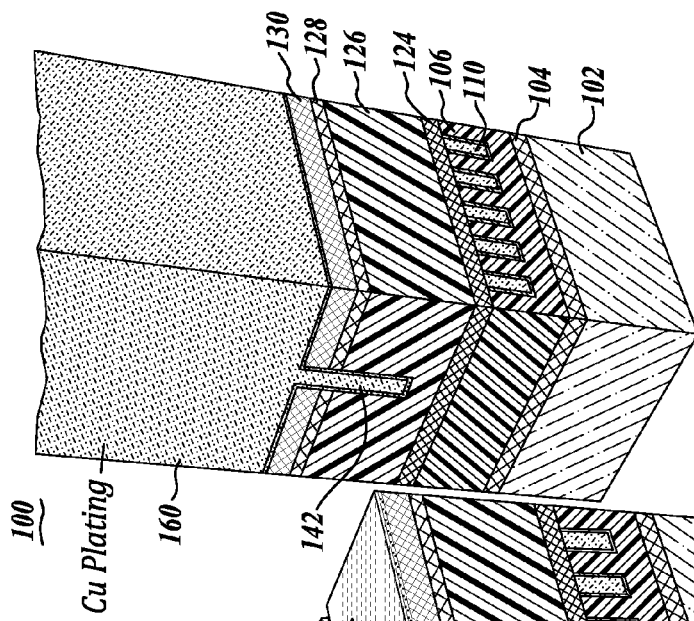
FIG. 5C is a view of the workpiece of FIG. 5B after metallization and overburden plating.
Figure 5B:
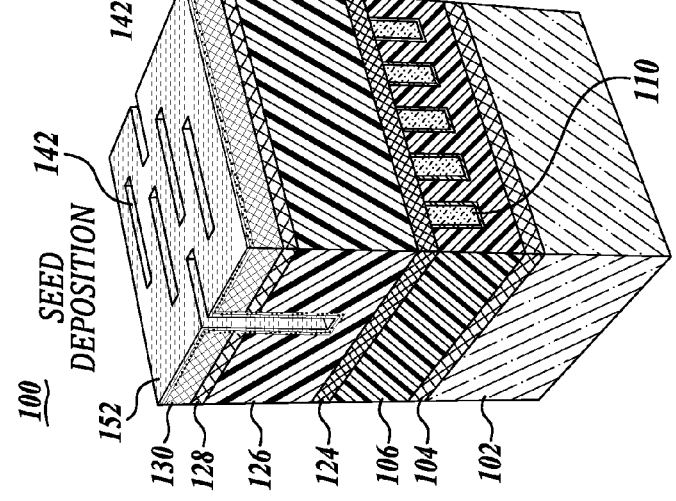
FIG. 5B is a view of the workpiece of FIG. 5A after seed deposition.
Figure 5A:
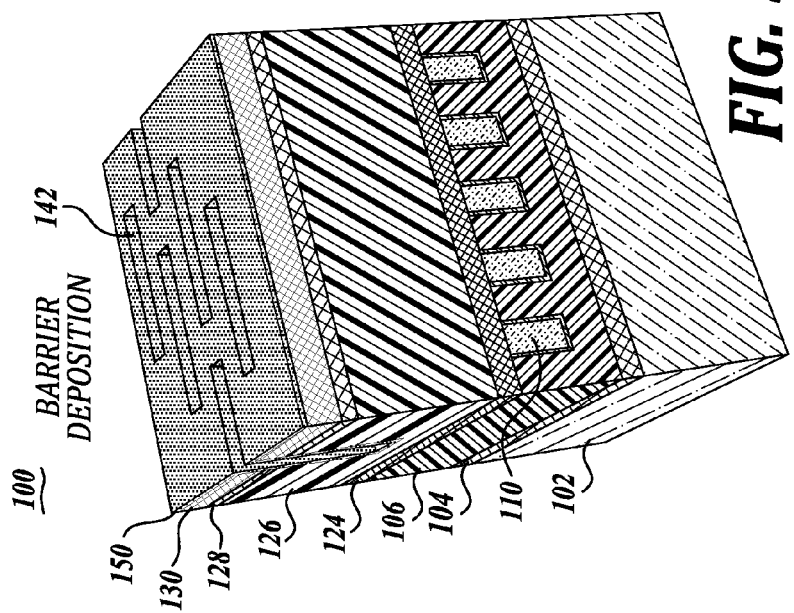
FIG. 5A is a view of the workpiece of FIG. 4C after barrier deposition.

Next, as illustrated in FIGS. 5A and 5B, the etched and repaired trenches 142 are prepared for metallization. A barrier layer 150 is deposited, followed by deposition of a seed layer 152. The methodology of the present disclosure is not limited to a particular barrier layer. However, as noted above, the barrier layer may typically be of a refractory metal or refractory compounds, for example, titanium (Ti), tantalum (Ta), titanium nitride (TiN), tantalum nitride (TaN), etc. The barrier layer can be applied using different deposition techniques, for example, physical vapor deposition (PVD), chemical vapor deposition (CVD), or atomic layer deposition (ALD). These deposition techniques are known in the art. Barrier layers are typically used to isolate copper or copper alloys from the dielectric material; however, in the case of other metal interconnects, diffusion may not be a problem and so barrier layering may not be required.

As shown in FIG. 5B, a barrier layer 150 deposition may be followed by an optional seed layer 152 deposition. The purpose of the seed layer 152 can provide a low-resistance electrical path, which enables more uniform electrical plating over the barrier layer and/or to assist the copper or other trench material to adhere well to the barrier layer, thereby to provide a continuous platable film to plate on. As such, the seed layer 152 can be composed of a metal such as copper, cobalt, nickel, gold, silver manganese, tin, aluminum, or ruthenium. Also, metal alloys can be used to form the seed layer, including, for example, a copper alloy, such as copper manganese, copper cobalt, or copper nickel. The seed layer can also be composed of alloys of the other seed metals listed above. Also, various options exist for depositing a seed layer, such as using PVD for copper seed layer deposition. The seed layer may also be formed by using other deposition techniques, such as CVD or ALD.

The seed layer 152 can be a stack film, for example, a liner layer and a PVD seed layer. A liner layer is a material used on a barrier layer or between a barrier layer and a PVD seed layer to mitigate discontinuous seed issues and improve adhesion of the PVD seed to the barrier layer. Liner layers are typically composed of noble metals, such as ruthenium (Ru), platinum (Pt), palladium (Pd), and osmium (Os). Liners can also be composed of Co or Ni. Currently, CVD Ru and CVD Co are commonly used to create liners; however, liner layers may also be formed by using other deposition techniques, including ALD or PVD.

The seed layer 152 can also be a secondary seed layer, which is similar to a liner layer as being typically formed from noble metals, such as Ru, Pt, Pd, or Os. However, other materials may be utilized, including Co and Ni, and also commonly CVD Ru and CVD Co. As in seed and liner layers, secondary seed layers may also be formed using ALD, PVD, or other deposition techniques. A secondary seed layer differs from the liner layer is the secondary seed layer actually serves as the seed layer, whereas the liner layer is an intermediate layer between the barrier layer and the PVD seed layer.

After the seed layer 152 has been deposited, the trenches may be filled with copper using, for example, electrochemical deposition under acid deposition chemistry ("ECD"). Conventional ECD copper acid chemistry may include, for example, copper sulfate, sulfuric acid, hydrochloric acid, and organic additives (such as accelerators, suppressors, and levelers). Electrochemical deposition of copper has been found to be a cost-effective manner by which to deposit a copper metallization layer. In addition to being economically viable, ECD techniques provide a substantially "bottom up" (e.g., nonconformal) metal fill mechanically and electrically suitable for interconnected structures.

Other metals in addition to copper may be used for metallization, for example, Co, Ru, Ni, Ag, Au, Mn, Sn, or Al. In addition, metal alloys may be used to form the trenches. Exemplary copper alloys may include, but are not limited to, copper manganese and copper aluminum. As a non-limiting example, the alloy composition ratio may be in the range of about 0.5% to about 6%. Secondary metal alloy, as compared to the primary metal alloy (e.g., Cu, Co, Ni, Ag, Au, Mn, Sn, or Al).

Also, within the present disclosure, more than one metal alloy layer can be utilized. For example, a first layer can be composed of a first copper alloy followed by a second layer of another copper alloy. Also, the copper can be alloyed with more than one dopant. For example, the copper alloy(s) can consist of Cu and Ag, Cu and Au, Cu and Ti, etc.

In addition to filling the trenches 142, a metal overburden layer 160 is formed, as schematically illustrated in FIG. 5C. FIG. 5C shows a relatively thick layer of copper metal overburden which may be plated using conventional electrochemical deposition (ECD) technology, which is well known in the semiconductor art. Other options for plating include electrochemical deposition, electroless deposition, or electrografting. If electroless deposition or electrografting is used, a seed layer, such as layer 152, may not be required or necessary.

With respect to the plating of the trenches, reflow techniques can be used to improve gap fill. For example, in one embodiment to the present disclosure, the conformal metal layer is deposited using an ECD seed process, and then may be modified using a process referred to as ECD seed Plus deposition (or ECD seed "plus"), which includes a thermal treatment step. In other embodiments of the present disclosure, the conformal metal layer may be deposited using CVD, ALD, or other deposition techniques. In accordance with embodiments of the present disclosure, the conformal layer is flowable when subjected to thermal treatment or annealing.

In one embodiment, ECD seed "plus" generally refers to ECD metal seed deposition plus a thermal treatment step, such as an annealing step. In one embodiment of the present disclosure, the thermal treatment step may result in reflow of some or all of the seed deposition. In contrast to conventional ECD metal fill (using acid chemistry), ECD seed "plus" deposition is similar to ECD seed deposition (using basic chemistry), but adds a thermal treatment step. Moreover, instead of just depositing a seed layer, ECD seed "plus" can be performed so as to partially or fully fill the features. With the ECD seed "plus" process, substantially void-free fill of small features can be achieved. The ECD seed "plus" process is described in U.S. provisional application Nos. 61/638,851 and 61/638,856, incorporated herein by reference, and in corresponding U.S. patent application Ser. Nos. 13/801,786 and 13/801,860, also incorporated herein by reference.

The chemistry used in the ECD chamber for ECD seed "plus" deposition may include a basic chemistry, for example, Cu(ethylenediamine)2 at a pH in the range of about 8 to about 10, and in one embodiment of the present disclosure about 9.3. However, acidic chemistries using proper organic additives may also be used to achieve conformal ECD seed deposition.

After ECD seed deposition, the workpiece may then be subjected to the spin, rinse, and dry (SRD) process or other cleaning processes. The ECD seed is then heated at a temperature warm enough to get the seed to reflow, but not too hot the workpiece or elements on the workpiece are damaged or degraded. For example, the temperature may be in the range of about 100° C. to about 500° C. for seed reflow in the features. Appropriate thermal treatment or annealing temperatures are in the range of about 100° C. to about 500° C., and may be accomplished with equipment capable of maintaining sustained temperatures in the range of about 200° C. to about 400° C., and at least within the temperature range of about 250° C. to about 350° C.

The thermal treatment or annealing process may be performed using a forming or inert gas, pure hydrogen, or a reducing gas such as ammonia (NH3). During reflow, the shape of the deposition changes, and the metal deposit may pool in the bottom of the feature. In addition to reflow during the thermal treatment process, the metal deposit may also grow larger grains and reduce film resistivity. An inert gas may be used to cool the workpiece after heating.

The ECD seed deposition and reflow steps may be repeated for a desired level of filling of the feature with ECD seed. Processes described herein may include one or more ECD seed deposition, cleaning (such as SRD), and thermal treatment cycles.

Figure 6:
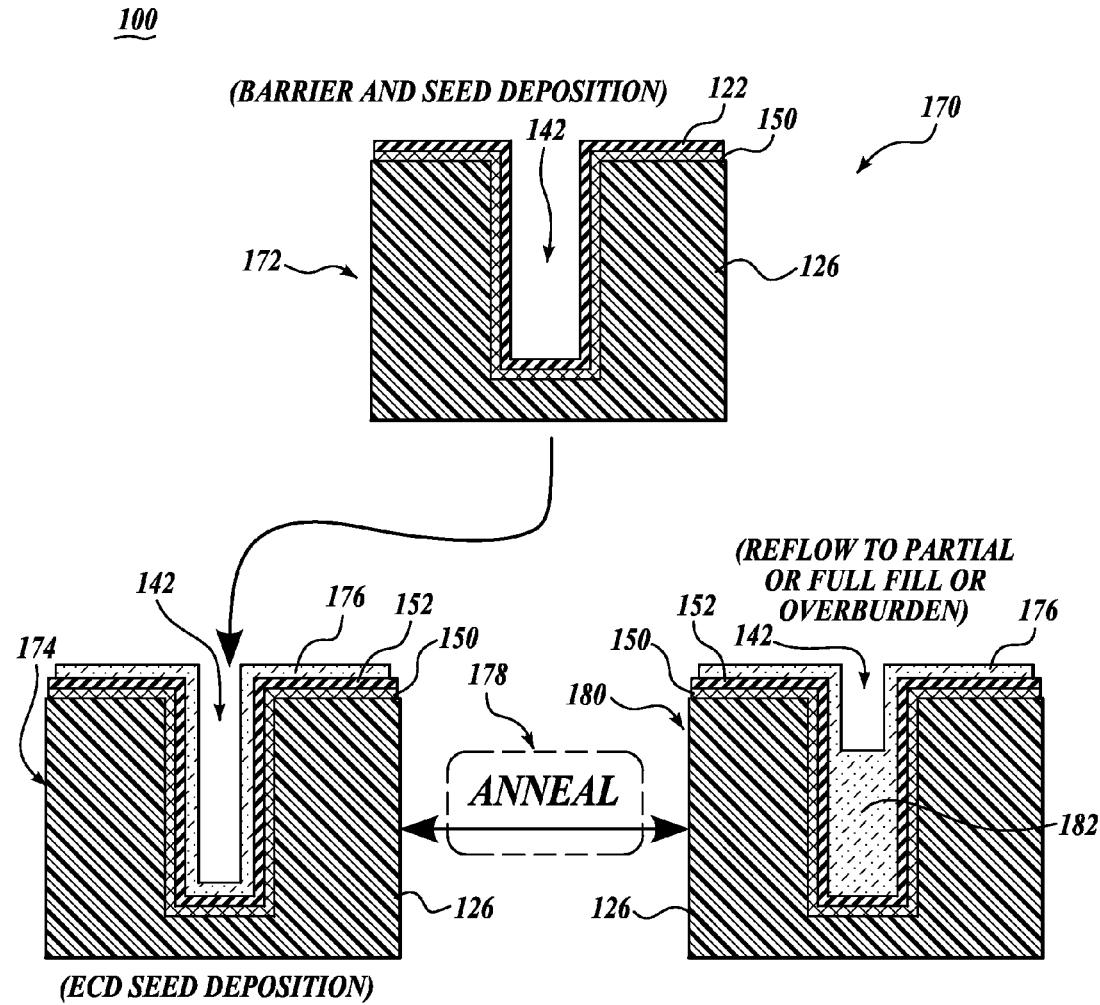

FIG. 6 illustrates a reflow process 170 and exemplary features created by the reflow process are depicted. The workpiece may be in an exemplary embodiment a dielectric material on a crystalline silicon substrate containing at least one feature 142. In exemplary step 172, the trench 142 is lined with a barrier layer 150 and then a seed layer 152. In exemplary step 174, the feature 142 of the workpiece has received a layer of ECD seed material 176 on the seed layer 152. In exemplary anneal step 178, the workpiece is annealed at an appropriate temperature to induce the exemplary reflow step 180 to encourage partial fill. During the anneal step, ECD seed material 176 flows into the feature 142 to form a fill section 182. In an exemplary embodiment, ECD seed deposition step 174, anneal step 178, and reflow step 180 may be repeated to attain the desired characteristics of fill 182. The number of repeating steps may depend on the structure. Also, a metal overburden, for example, copper, is plated by conventional ECD. Once fill 182 reaches desired dimensions, the remaining steps of the present process are carried out, as discussed below.

In the alternative to a conformal ECD and an anneal process, feature fill may be achieved using a superconformal ECD process. This "Super ECD" process may use an alkaline electrolyte including at least one organic additive to result in superconformal fill.

Organic additives are commonly used in conventional acid ECD fill and cap in a feature, for example, using an acid deposition electrolyte. Conventional ECD copper acid chemistry may include, for example, copper sulfate, sulfuric acid, methane sulfonic acid, hydrochloric acid, and organic additives (such as accelerators, suppressors, and levelers). Electrochemical deposition of copper has been found to be a cost effective manner to deposit a copper metallization layer. In addition to being economically viable, the organic additives use in ECD deposition techniques provide for a substantially bottom up (e.g., superconformal) metal fill mechanically and electrically suitable for interconnect structures.

The organic additives used in conventional ECD fill are generally not used in alkaline ECD seed deposition processes because conformal deposition (not bottom-up fill) is usually desirable in an ECD seed deposition process (see FIG. 1B). However, in accordance with embodiments of the present disclosure, the inventors have found using such additives with an ECD seed electrolyte has an advantageous effect of encouraging bottom-up fill (known as "super conformal" deposition or "Super ECD"), as opposed to pure conformal deposition.

Figure 7:
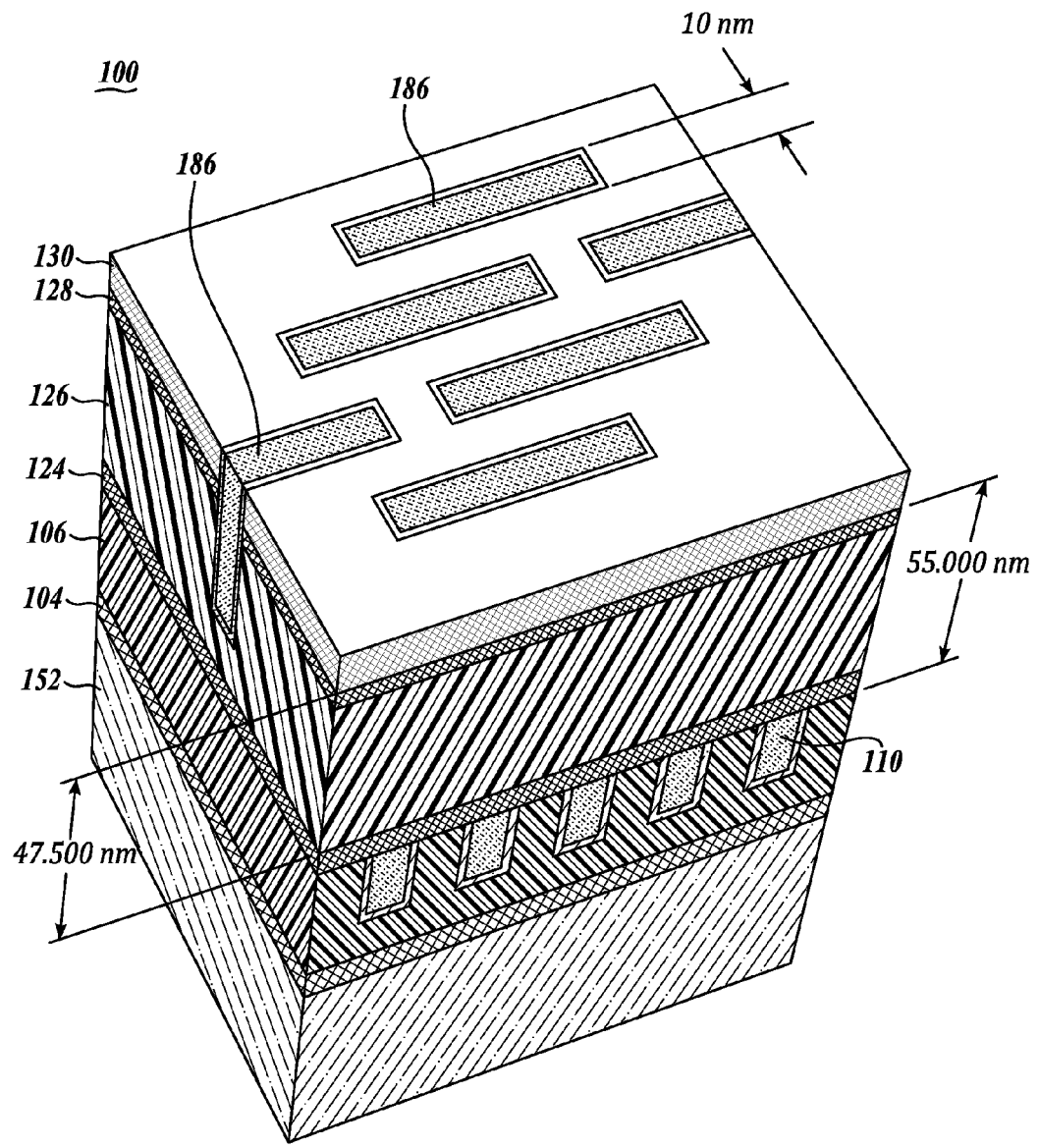
FIG. 7 is a schematic view of the workpiece of FIG. 5C after CMP procedure.

As shown in FIG. 7, the metal overburden 160 is removed by CMP in a standard manner. FIG. 7 shows the CMP step is stopped at the top surface of the hard mask 130. However, alternatively the CMP process can also be used to remove the hard mask layer 130 leaving the uppermost layer as barrier layer 128. As shown in FIG. 7, after the CMP process, the metal lines 186 are now defined.

Figure 8A:
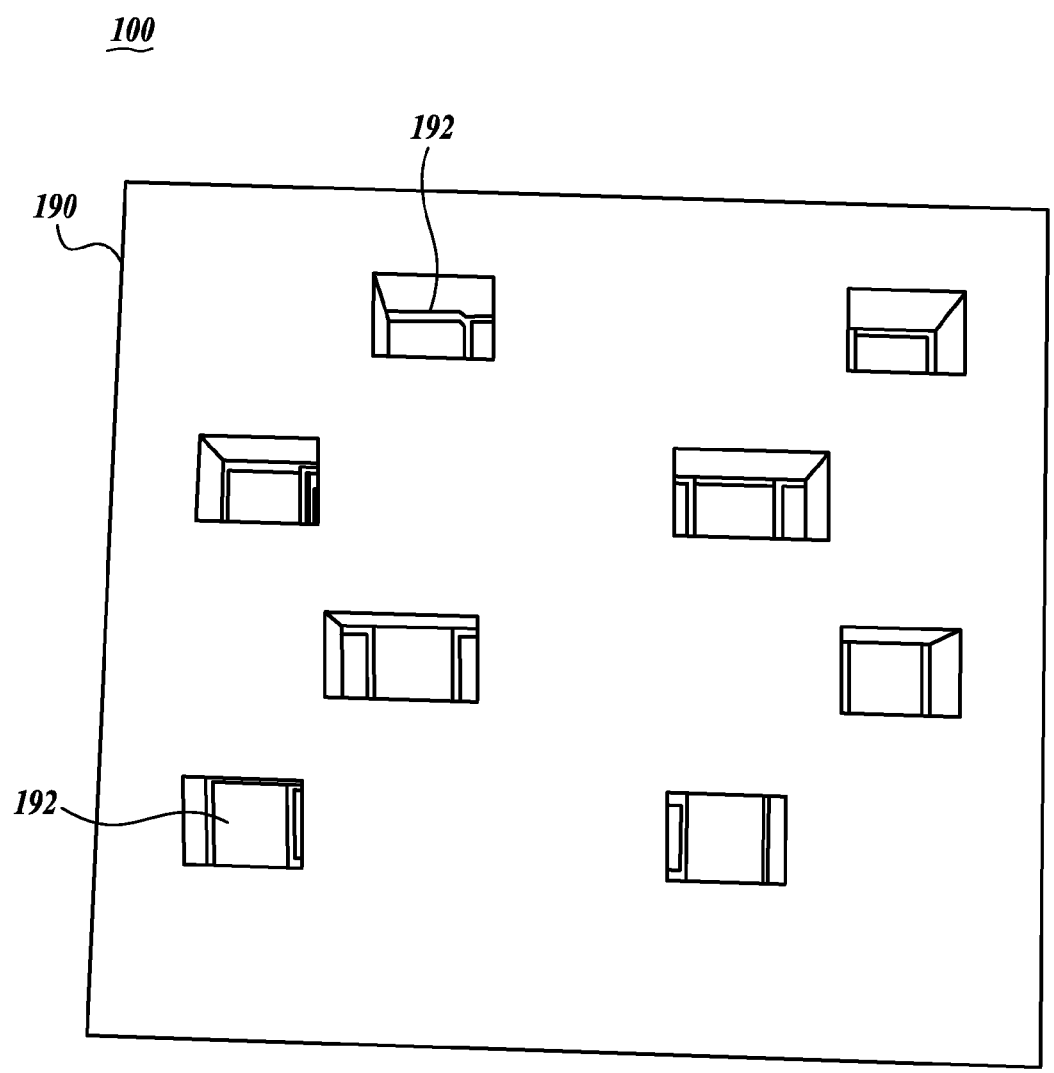
FIG. 8A is a top schematic view of the workpiece of FIG. 7 after photoresist application and patterning of vias.
Figure 8B:
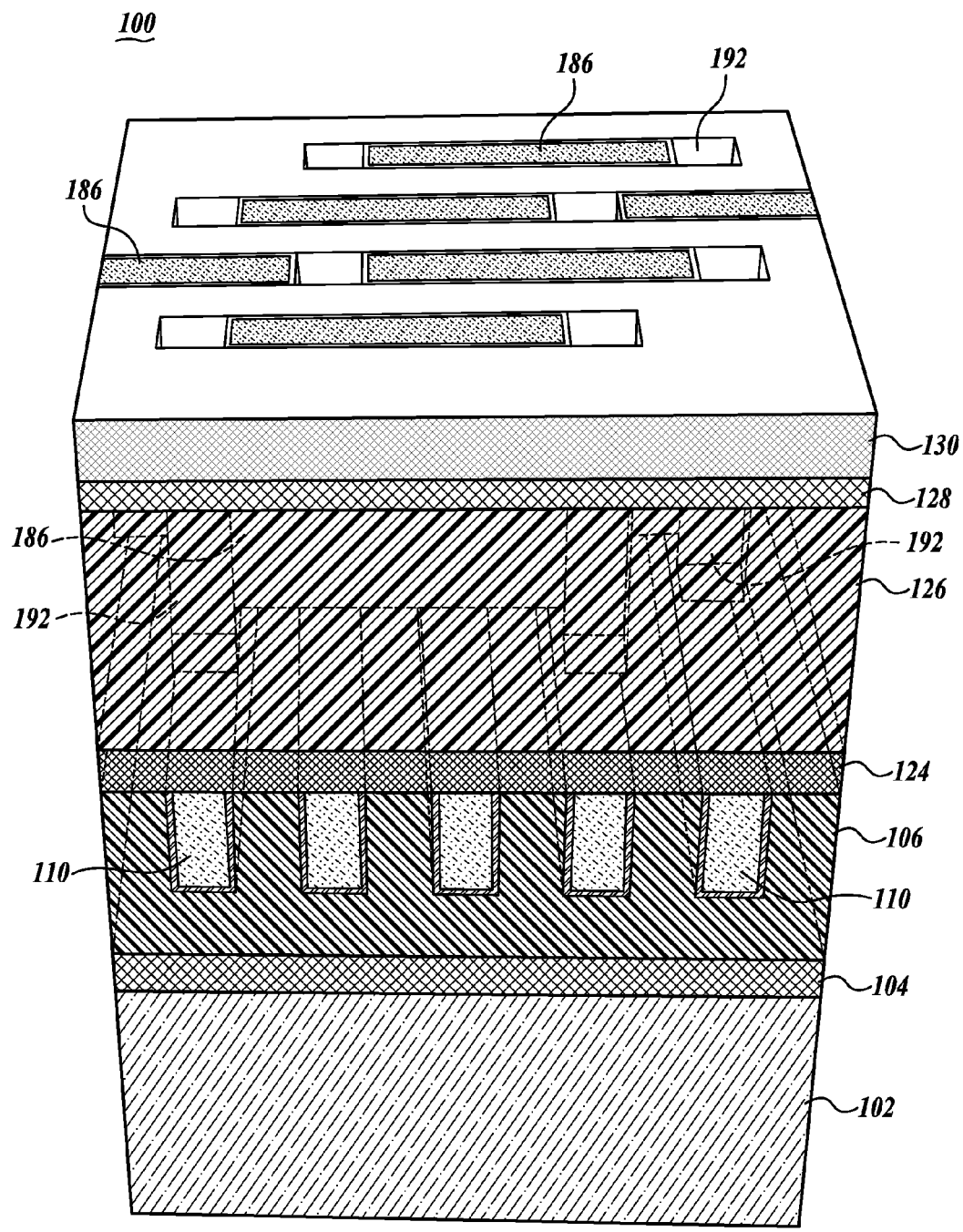
FIG. 8B is an isometric view of the workpiece of FIG. 8A after via etch.

Next, as shown in FIGS. 8A and 8B, the steps of via patterning and via etch are carried out. Referring initially to FIG. 8A, a photoresist and supported films 190 are deposited on the workpiece over the hard metal mask 130. Vias 192 are patterned using photolithography. The vias 192 are positioned in alignment with and abutting the adjacent ends of metal lines 186. Alignment of the vias to the trenches is critical in the direction perpendicular to the trenches but not so critical in the direction parallel to the trenches, because the trenches define the vias in the direction parallel to the trenches. The alignment parameters allows for more relaxed lithography control in the axis parallel to the direction of the trenches.

The hard mask system can be employed to assist in self-aligning the vias to the trenches, assuming the hard mask is not removed at etch or by CMP. Lithography using a hard mask, as noted above, is well known in the art. FIG. 8A is a top view of the workpiece showing the patterned structure following the hard mask etch step. As shown, the vias may be wider in the direction along the metal lines 186 than in the direction perpendicular to the metal lines.

Next, via etch through the dielectric layer 126 and resist strip 124 is performed. FIG. 8B shows the vias 192 extending down through the dielectric layer 126 and resist strip 124 to intersect lines 110 within the dielectric layer 106. FIG. 8B depicts a workpiece after the photoresist strip etch. The vias 192 are ready to be filled.

Figure 9A:
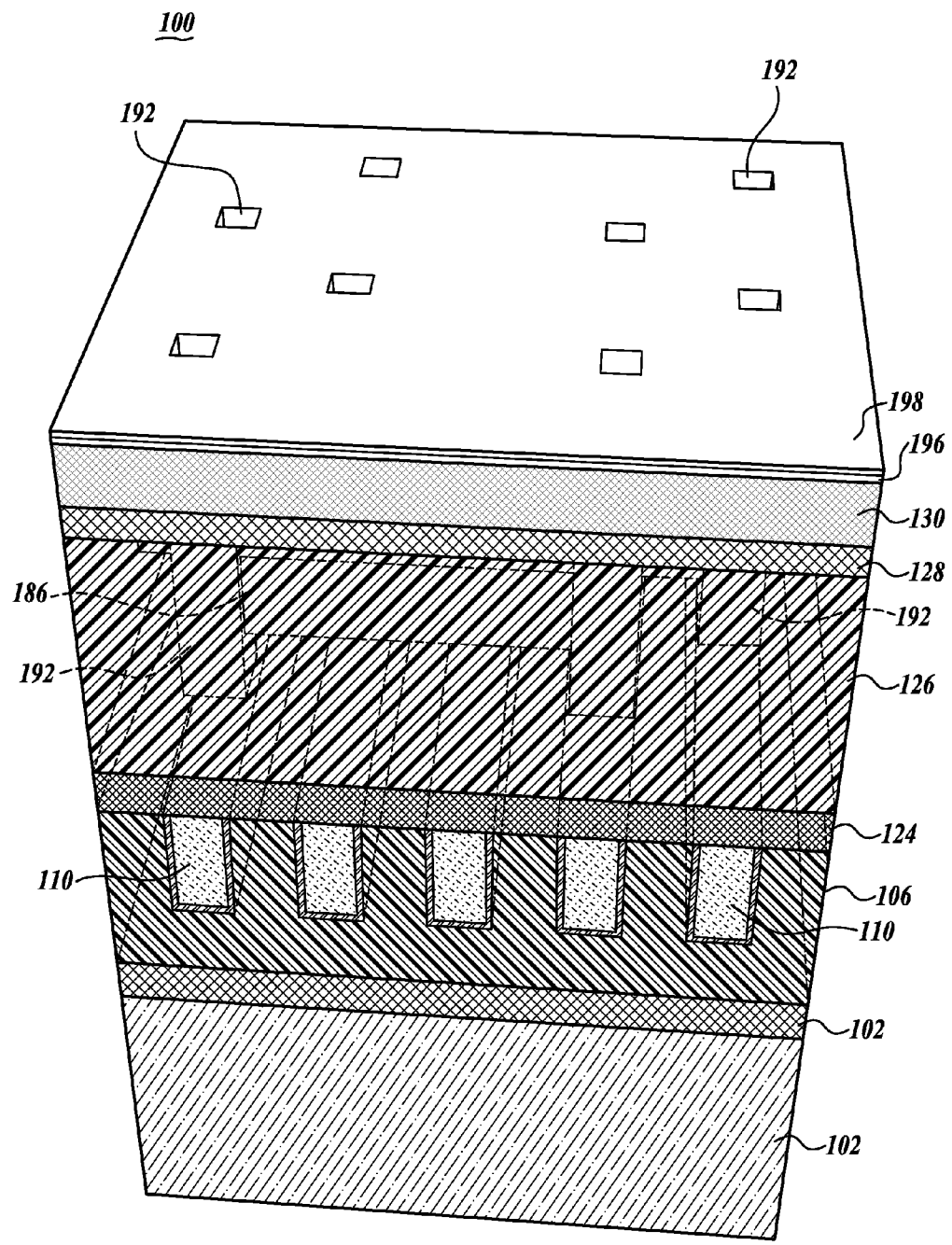
FIG. 9A is an isometric view of the workpiece of FIG. 8B after barrier layer deposition and after seed layer deposition.
Figure 9B:
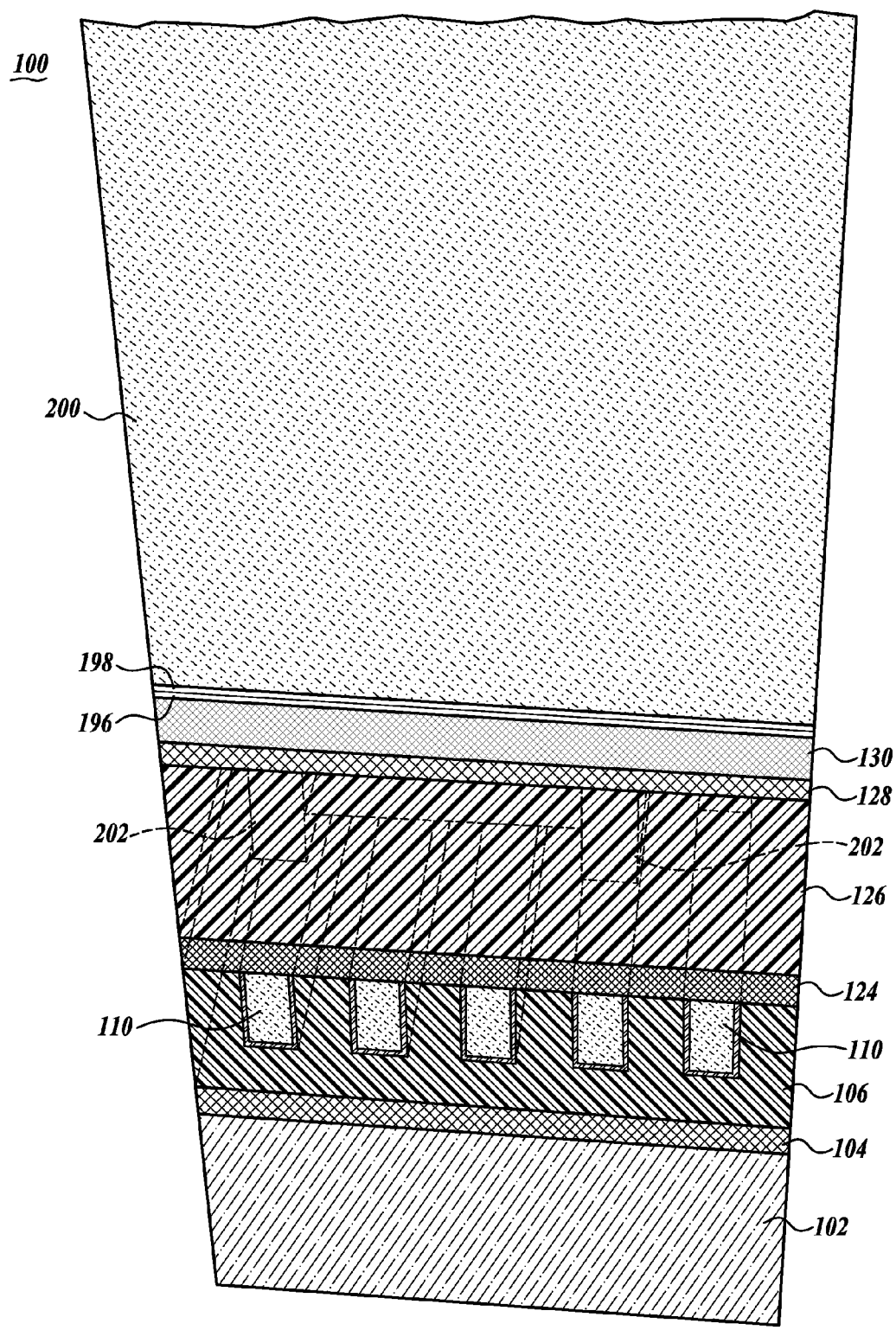
FIG. 9B is an isometric schematic view of the workpiece of FIG. 9A after metal fill and overburden deposition.

The filling of the vias 192 is illustrated in FIGS. 9A and 9B. FIG. 9A depicts vias following deposition of a barrier layer 196 and a seed layer 198. The barrier layer and seed layer can be deposited in the via in processes and procedures the same as or similar to the application of the barrier and seed layers to the trenches 142 as described above. As such, these steps will not be repeated here.

The via metal is plated on the conformal seed film so as to provide a void-free via fill. The fill metal or metal alloy can be the same as or similar to processes used for forming the metal lines 186. The deposition of the metal fill can be by numerous techniques, such as by CVD or by CVD followed by plating of an overburden layer 200, as shown in FIG. 9B. As another alternative, electroless deposition can be utilized. A sputter etch step can be used to "punch through" the barrier layer 124 to provide contact between the filled metallic vias 202 and the metallic lines 110. In electroless deposition, a seed layer 198 within the vias 192 is not required. Rather, electroless deposition, using the underlying metal as seed, can be used to fill the vias with a metal conductor. Such conductors may include, for example, Cu, Al, Mn, Co, Au, Ag, W, Ti, Ni, or alloys thereof.

Because the vias 192 are confined and are not separated from the metal lines 110 by a barrier, a complete void-free metal fill of the vias is not mandatory, which is a distinguishing feature of the methodology of the present disclosure.

Figure 10A:
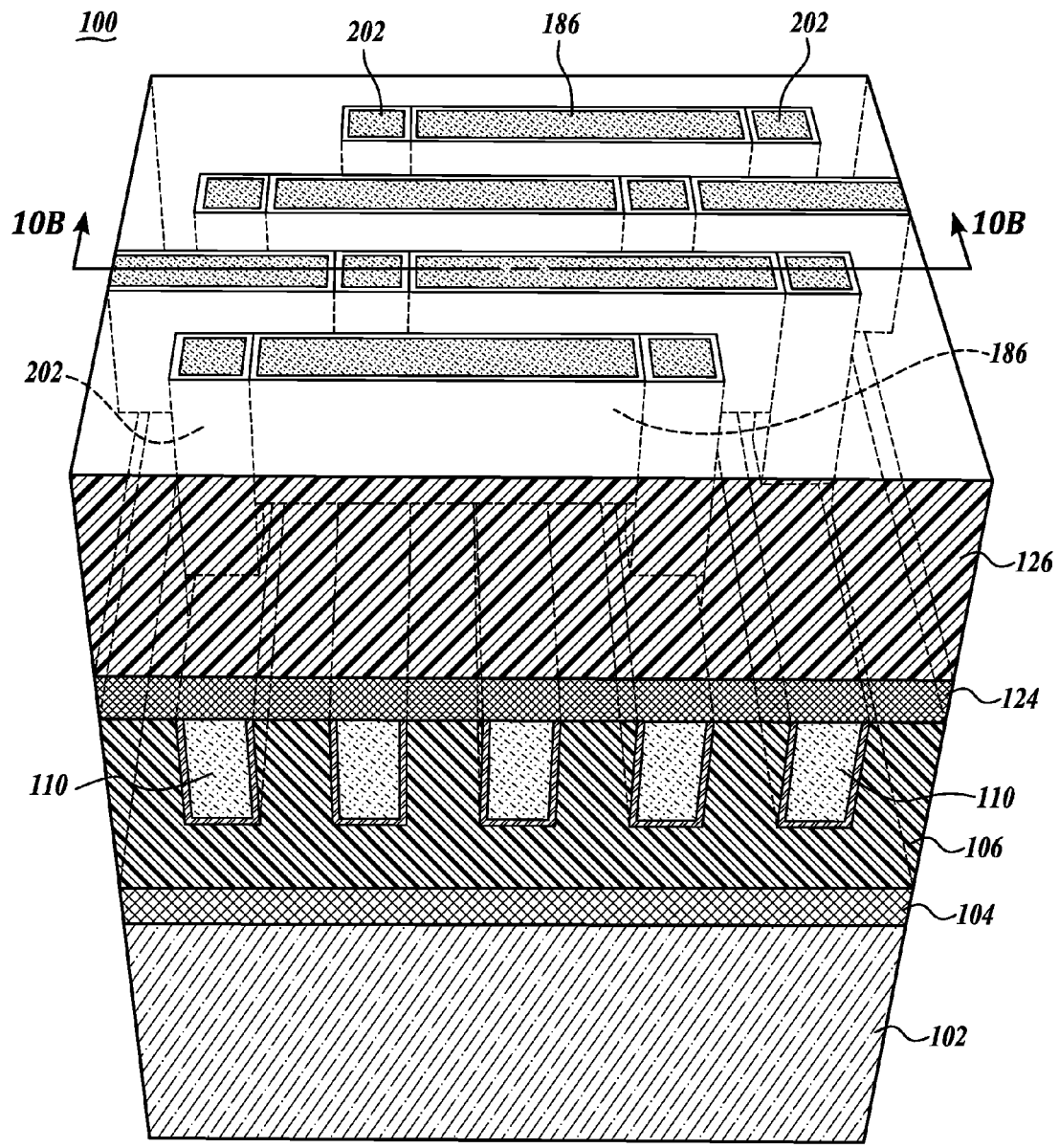
FIG. 10A is an isometric view of the workpiece of FIG. 9B after CMP process to remove the overburden.
Figure 10B:
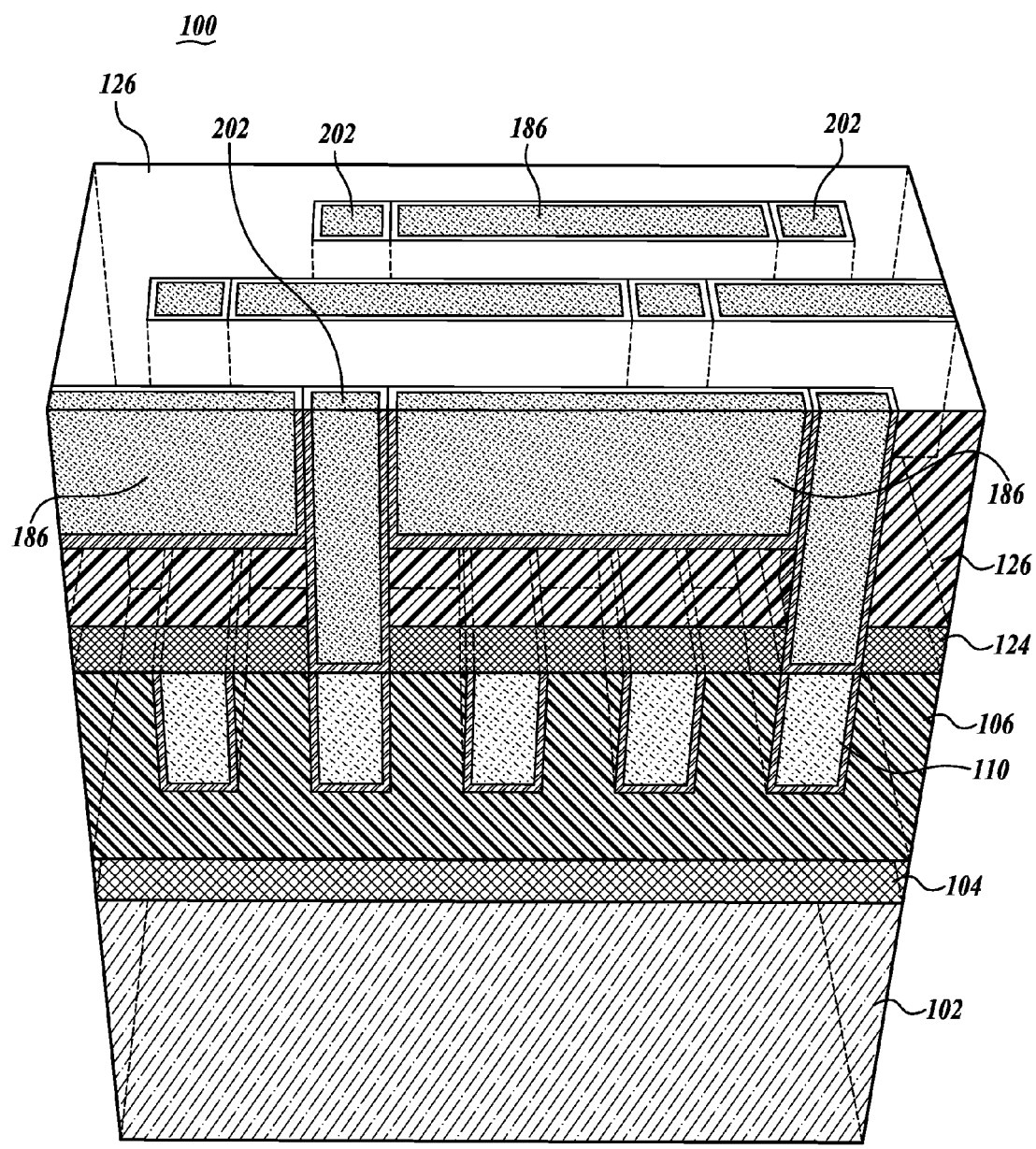
FIG. 10B is a cross-sectional view through lines 10B-10B of FIG. 10A.

FIGS. 10A and 10B illustrate the completed metal layer after the use of CMP to remove the metallic overburden 200. FIG. 10A is an exterior view of the completed workpiece, and FIG. 10B is a cross-sectional view taken along the lines 10B-10B of FIG. 10A. As shown in these figures, the filled vias 202 extend downwardly between the ends of trenches (metal lines) 186, which accurately aligns the vias with the lower metal lines 110 to which connection is desired.

Figure 10C:
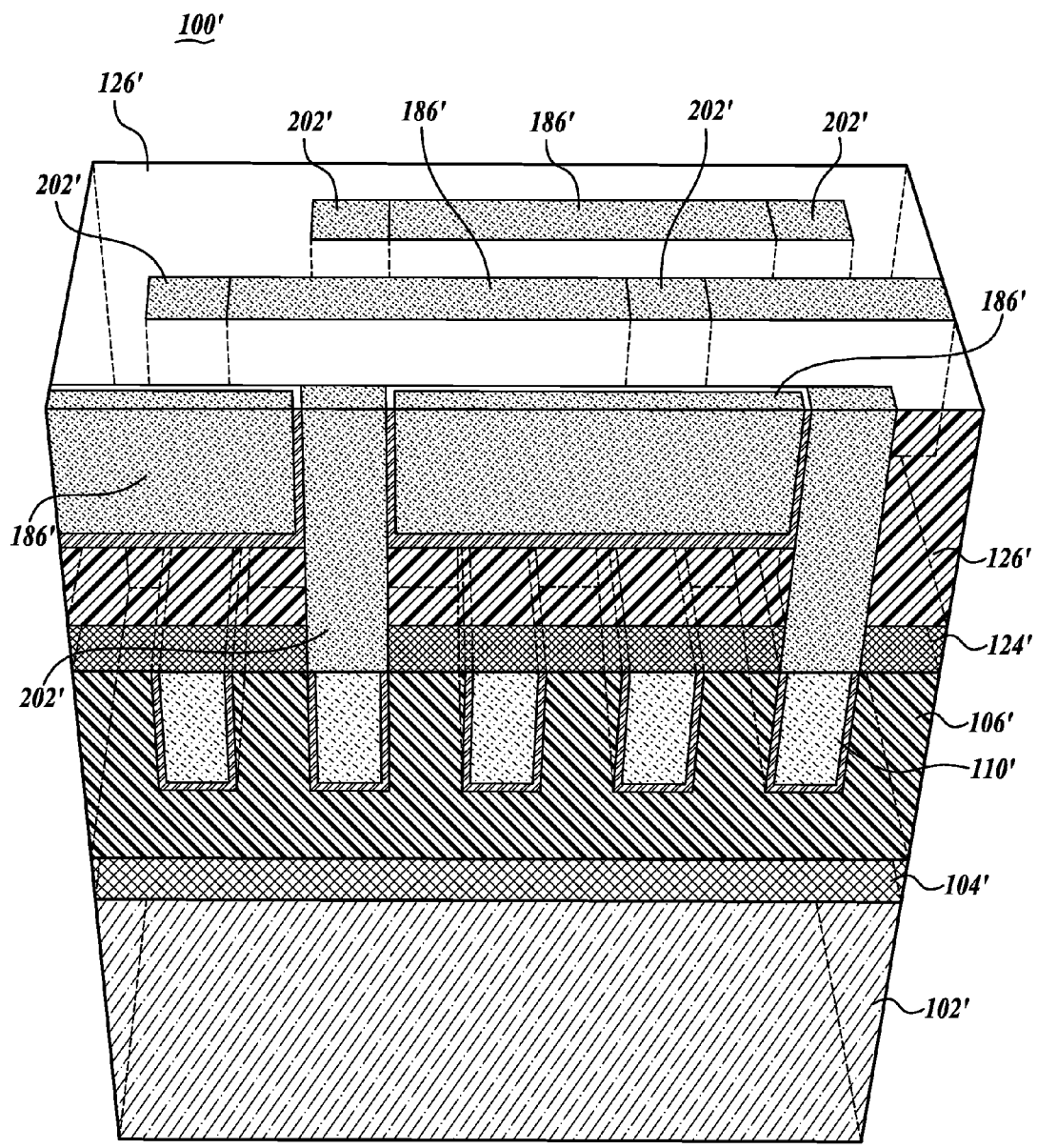
FIG. 10C is a cross-sectional view similar to FIG. 10B but of an alternative embodiment of the present disclosure.

FIG. 10C illustrates an alternative embodiment of the present disclosure which is very similar to the embodiment of FIGS. 10A and 10B. Consequently, the same part numbers are utilized in FIG. 10C as in FIGS. 10 and 10B, but with the addition of a prime sign. The embodiment of FIG. 10C differs from the embodiment of FIGS. 10A and 10B because a barrier layer does not extend between the sides of the vias 202' and the ends of the metal lines. Thus, only one barrier layer is interposed between the vias 202' and the ends of the trenches 186'. A barrier layer in these locations may not be needed if the via is not filled with Cu but instead filled with other metals such as Co, Ni or W or filled with an alloy such as NiSi or CoSi, nano wires, carbon nano tubes, or graphene. The same is true between the bottom of the vias and the top side of lower metal lines 110'. A barrier still may be used to encapsulate the lower metal lines 110' in FIG. 10C. Other than these exceptions, the workpiece 100' shown in FIG. 10C can be the same as or similar to workpiece 100 shown in FIGS. 10A and 10B.

While the preferred embodiment of the disclosure has been illustrated and described, various changes can be made therein without departing from the spirit and scope of the disclosure.

For example, rather than utilizing the disclosure of the present disclosure to form interconnects between trenches/lines and vias, the present method can be utilized to position and form isolated vias not functionally connected to any or all of the adjacent trenches/lines. A barrier layer of the trenches and/or vias can be utilized to isolate the vias from the trenches as desired. In other words, the vias can be connected to some lines, as desired, but not connected to other lines, in a selected manner or not connected to any line at all. The vias may be connected to metal in the layers above and below the vias. The connection may form "express vias" connecting upper layers to lower layers while by-passing the metallization in the layer where the vias are. Nonetheless, the method of the present disclosure advantageously utilizes the separation or gaps between adjacent trenches/lines to locate/position/constrain vias formed in the semiconductor workpieces.

The non-binding examples depicted in FIGS. 3-10C would be referred to as a "trench first" approach. "Via first" integration is also within the scope of the present disclosure. "Via first" integration can be accomplished by performing processes shown and described with reference to one or more of FIG. 8A-10C prior to the processes shown and described with reference to one or more of FIGS. 3-7.

The embodiments of the invention in which an exclusive property or privilege is claimed are defined as follows:

1. A method of forming an interconnect including trenches and vias in a workpiece, the method comprising:
    applying a dielectric film stack on the workpiece;
    applying a hard mask over the dielectric film stack;
    applying a photoresist over the hard mask;
    patterning trenches in the photoresist, the trenches being patterned in longitudinal segments disposed end-to-end to each other, the segments longitudinally spaced apart from each other at locations where vias are to be located;
    etching trenches into the dielectric film stack;
    filling the trenches with a conductive material;
    patterning vias in the gaps separating the ends of longitudinally related filled trenches;
    etching the patterned vias in the workpiece; and
    filling the etched vias with the conductive material.

2. A method of forming an interconnect including trenches and vias in a workpiece, the method comprising:
    applying a dielectric film stack on the workpiece;
    applying a hard mask over the dielectric film stack;
    applying a photoresist over the hard mask;
    patterning vias in the photoresist defining gaps separating vias;
    etching the patterned vias in the workpiece;
    filling the etched vias with a conductive material;
    patterning trenches in the photoresist, the trenches being patterned in longitudinal segments disposed end-to-end to each other in the gaps separating the vias, the segments longitudinally spaced apart from each other at the locations of the vias;
    etching trenches into the dielectric film stack; and
    filling the trenches with the conductive material.

3. A semiconductor workpiece comprising trenches and vias produced by:
    applying a dielectric composition on the workpiece;
    applying a hard mask over the dielectric composition;
    applying a photoresist over the hard mask;
    patterning trenches in the photoresist, the trenches being patterned in longitudinally arranged segments disposed end-to-end to each other, the longitudinal segments spaced apart from each other at locations where vias are to be located;
    etching trenches into the dielectric composition;
    filling the trenches with a conductive material;
    patterning vias in the gaps separating the ends of longitudinally related trenches;
    etching the patterned vias in the dielectric composition; and
    filling the etched vias with the conductive material.

4. The workpiece of claim 3, wherein, after formation of the trenches, the photoresist is applied over the trenches, and the vias are patterned on such photoresist.

5. The workpiece of claim 3, wherein, after the etching of the vias, a barrier layer is deposited over the via sidewall surface.

6. The workpiece of claim 3, wherein a metal overburden of the via fill material is applied to the workpiece.

7. The workpiece of claim 3, further comprising removing the overburden to reduce the height of the workpiece to expose the conductive material filled trenches and aligned vias.

8. A semiconductor workpiece comprising trenches and vias produced by:
    applying a dielectric film stack on the workpiece;
    applying a hard mask over the dielectric film stack;
    applying a photoresist over the hard mask;
    patterning vias in the photoresist defining gaps separating the vias;
    etching the patterned vias in the workpiece;
    filling the etched vias with a conductive material;
    patterning trenches in the photoresist, the trenches being patterned in longitudinal segments disposed end-to-end to each other in the gaps separating the vias, the segments longitudinally spaced apart from each other at the locations of the vias;
    etching trenches into the dielectric film stack; and
    filling the trenches with the conductive material.

* * * * *